(12) United States Patent
Huang

(10) Patent No.: US 8,179,670 B2
(45) Date of Patent: May 15, 2012

(54) MEMORY STICK

(75) Inventor: Joseph Huang, Taoyuan (TW)

(73) Assignee: Ho E Screw & Hardware Co., Ltd., Lu-Chu, Taoyuan (TW)

( * ) Notice: Subject to any disclaimer, the term of this patent is extended or adjusted under 35 U.S.C. 154(b) by 85 days.

(21) Appl. No.: 12/793,209

(22) Filed: Jun. 3, 2010

(65) Prior Publication Data

US 2011/0013354 A1 Jan. 20, 2011

(30) Foreign Application Priority Data

Jul. 20, 2009 (TW) .............................. 98124371 A

(51) Int. Cl.
*G06F 1/16* (2006.01)
*H05K 5/00* (2006.01)
*H05K 7/00* (2006.01)

(52) U.S. Cl. .............. 361/679.31; 361/679.02; 439/131; 439/135

(58) Field of Classification Search ............. 361/679.01, 361/679.02, 679.31; 439/131, 135, 136, 439/142
See application file for complete search history.

(56) References Cited

U.S. PATENT DOCUMENTS

| | | | | |
|---|---|---|---|---|
| D444,788 S * | 7/2001 | Do et al. | ................... | D14/480.6 |
| 6,522,534 B1 * | 2/2003 | Wu | ............................ | 361/679.4 |
| 6,778,401 B1 * | 8/2004 | Yu et al. | ........................ | 361/752 |
| 6,926,544 B2 * | 8/2005 | Lee | ................ | 439/147 |
| 6,932,629 B2 * | 8/2005 | Ikenoue | ........................ | 439/138 |
| 6,983,888 B2 * | 1/2006 | Weng | ............................. | 235/492 |
| D520,995 S * | 5/2006 | Chang | ........................ | D14/480.6 |
| D581,926 S * | 12/2008 | Kim | .......................... | D14/480.6 |
| 7,473,112 B2 * | 1/2009 | Zhu et al. | ....................... | 439/142 |
| 7,500,858 B2 * | 3/2009 | Emerson et al. | .............. | 439/136 |
| 7,530,823 B1 * | 5/2009 | Thornton et al. | ............. | 439/136 |
| 7,740,495 B1 * | 6/2010 | Lo | .................................. | 439/142 |
| 2005/0130469 A1 * | 6/2005 | Ikenoue | ........................ | 439/131 |
| 2008/0019090 A1 * | 1/2008 | Zhu et al. | ...................... | 361/684 |
| 2008/0026614 A1 * | 1/2008 | Emerson et al. | .............. | 439/136 |
| 2008/0192149 A1 * | 8/2008 | Lee | ................................. | 348/725 |
| 2008/0276099 A1 * | 11/2008 | Nguyen et al. | ................ | 713/186 |

* cited by examiner

Primary Examiner — Jinhee Lee
Assistant Examiner — Adrian S Wilson
(74) Attorney, Agent, or Firm — Guice Patents PLLC

(57) ABSTRACT

A memory stick includes a ⊏-shaped metal plate member having two tenones respectively protruded from an inner wall thereof at two opposite sides and aimed at each other, each tenon being formed on the ⊏-shaped metal plate member by means of punching the inner wall of the ⊏-shaped metal plate member with a punch to form a protrusion and then punching the protrusion with a punch rod to extend the height of the protrusion and to deform the protrusion into a tubular configuration, and a casing accommodating a PC board that has a USB connector at its one end and having two pivot holders symmetrically located on two opposite sides thereof and respectively pivotally coupled to the tenones of the ⊏-shaped metal plate member for enabling the ⊏-shaped metal plate member to be turned relative to the casing to close or open the USB connector.

5 Claims, 17 Drawing Sheets

MEMORY STICK

BACKGROUND OF THE INVENTION

1. Field of the Invention

The present invention is a divisional application of Taiwan Patent Application No. 98124371, entitled "Method of forming a tenon on one side of a metal plate member and memory stick using a metal plate member with a tenon". The present invention relates to a memory stick, which comprises a ⊏-shaped metal plate member having two tenones made by means of a punching technique, and a casing pivotally coupled to the ⊏-shaped metal plate member and turnable relative to the ⊏-shaped metal plate member to move a USB connector thereof in or out of the ⊏-shaped metal plate member.

2. Description of the Related Art

Forming a tenon on one side of a metal plate member for securing a swivel member is a pin-jointed technology. Forming a tenon on one side of a metal plate member must keep the other side of the metal plate member smooth without deformation. A conventional tenon formation method, as shown in FIG. 1, is the use of a punch to punch a metal plate member 90, thereby forming a tenon 901.

The punch 91 has an outer step 911, an inner step 912 and a recess 913 at the center of the inner step 912. When punching the metal plate member 90 with the punch 91, the inner step 912 will be driven into the wall of the corresponding side of the metal plate member 90, causing a part of the metal plate member 90 to be deformed into the desired tenon 901 by the recess 913.

This method can form an upwardly protruding tenon 901 at one side of the metal plate member 90, however the finished tenon 901 has a limited height. After installation, the connected member may fall from the tenon 901 accidentally.

FIGS. 2~5 show an application example of the aforesaid tenon 901 in a swivel type memory stick. As illustrated, the swivel type memory stick 92 comprises a ⊏-shaped metal plate member 921 and a casing 922. The casing 922 accommodates a PC board 923 that has a USB connector 924 located on one end and extended out of the casing 922. The ⊏-shaped metal plate member 921 has two tenones 901 protruded from the inner wall thereof at two opposite sides and respectively pivotally connected to a respective pivot holder 925 on the casing 922 such that the ⊏-shaped metal plate member 921 is turnable relative to the casing 922 between a close position and an open position to close or open the USB connector 924, as shown in FIGS. 3 and 4.

According to this design, the tenones 901 have a limited height. Thus, the connection area between the tenones 901 of the ⊏-shaped metal plate member 921 and the pivot holders 925 of the casing 922 is limited, as shown in FIG. 5, and therefore, the tenones 901 of the ⊏-shaped metal plate member 921 tend to be forced away from the pivot holders 925 of the casing 922 accidentally. An improvement in this regard is necessary.

SUMMARY OF THE INVENTION

The present invention has been accomplished under the circumstances in view. The invention provides a memory stick, which comprises a ⊏-shaped metal plate member having two tenones respectively protruded from an inner wall thereof at two opposite sides and aimed at each other, and a casing accommodating a PC board having a USB connector at its one end. The casing comprises two pivot holders symmetrically located on two opposite sides thereof and respectively pivotally coupled to the tenones of the ⊏-shaped metal plate member for enabling the ⊏-shaped metal plate member to be turned relative to the casing to close or open the USB connector. Further, each tenon of the ⊏-shaped metal plate member is formed on the ⊏-shaped metal plate member by means of punching the inner wall of the ⊏-shaped metal plate member with a punch to form a protrusion and then punching the protrusion with a punch rod to extend the height of the protrusion and to deform the protrusion into a tubular configuration.

Further, the ⊏-shaped metal plate member comprises two pairs of locating grooves located on the inner wall thereof at two opposite sides relative to each tenon. Further, the casing comprises two raised portions respectively disposed adjacent to the two pivot holders thereof for selectively engaging into the locating grooves to lock the casing to the ⊏-shaped metal plate member in one of two reversed positions to close or open the USB connector.

Further, the casing comprises a protruding block protruded from one lateral side thereof and suspending outside the ⊏-shaped metal plate member, facilitating user's manipulation to turn the casing out of the ⊏-shaped metal plate member.

Further, the ⊏-shaped metal plate member comprises a wire hole for the fastening of a cord member.

BRIEF DESCRIPTION OF THE DRAWINGS

FIG. 15A is an oblique bottom elevation of the ⊏-shaped metal plate member shown in FIG. 15.

DETAILED DESCRIPTION OF THE PREFERRED EMBODIMENT

Figure 1:
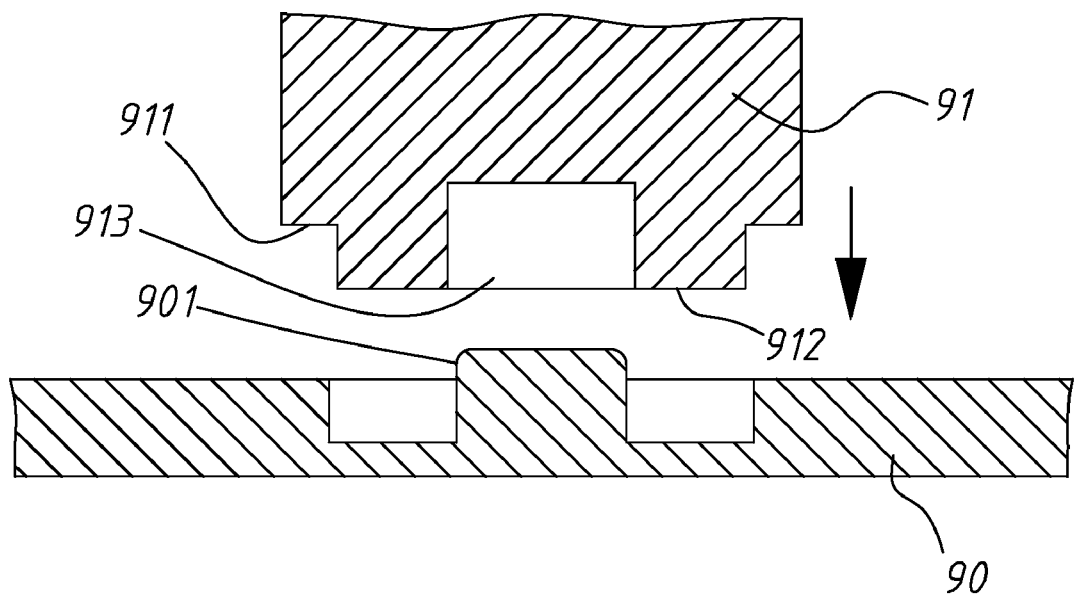
FIG. 1 is a schematic drawing showing the formation of a tenon on a metal plate member according to the prior art.
Figure 2:
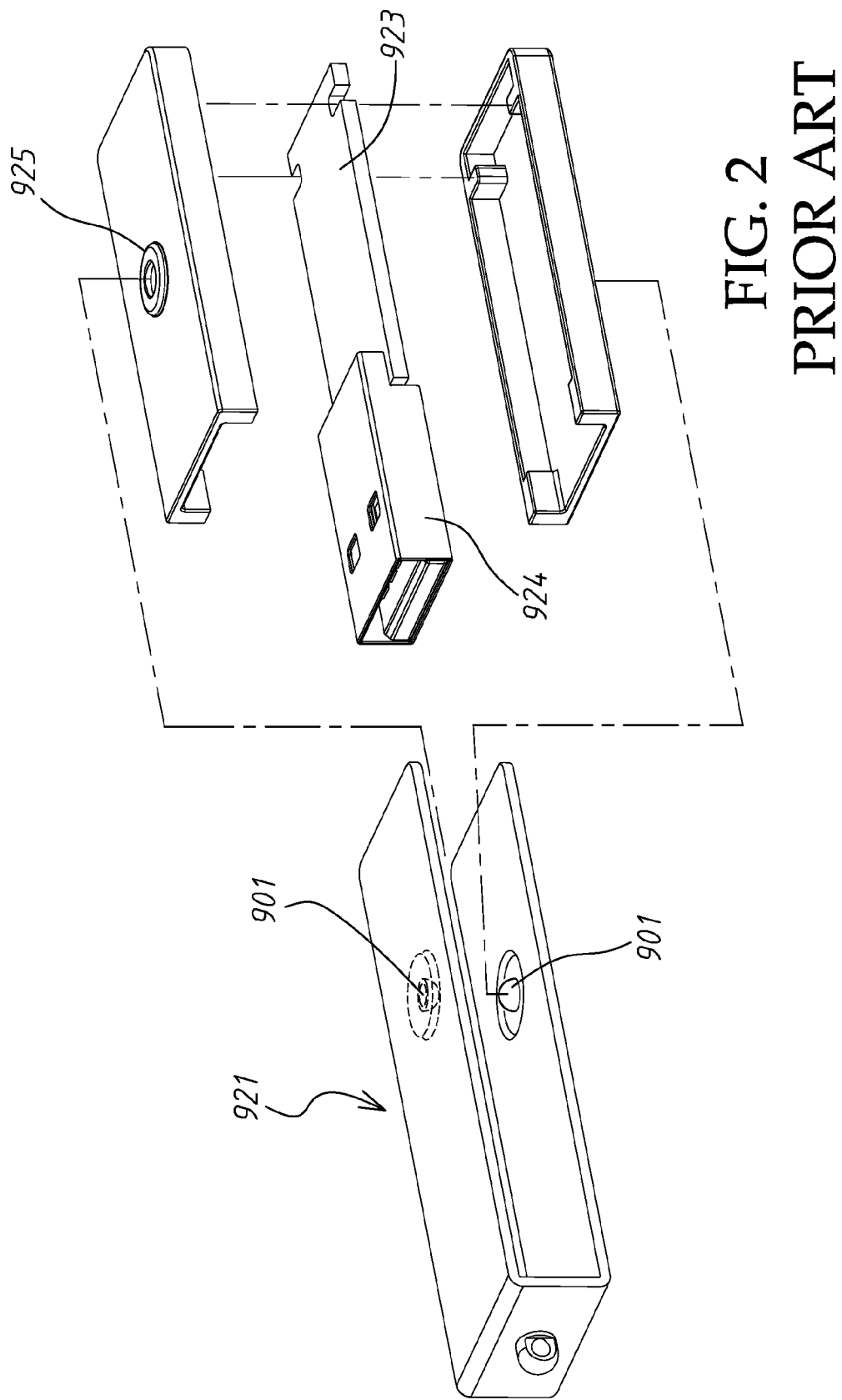
FIG. 2 is an exploded view of a memory stick according to the prior art.
Figure 3:
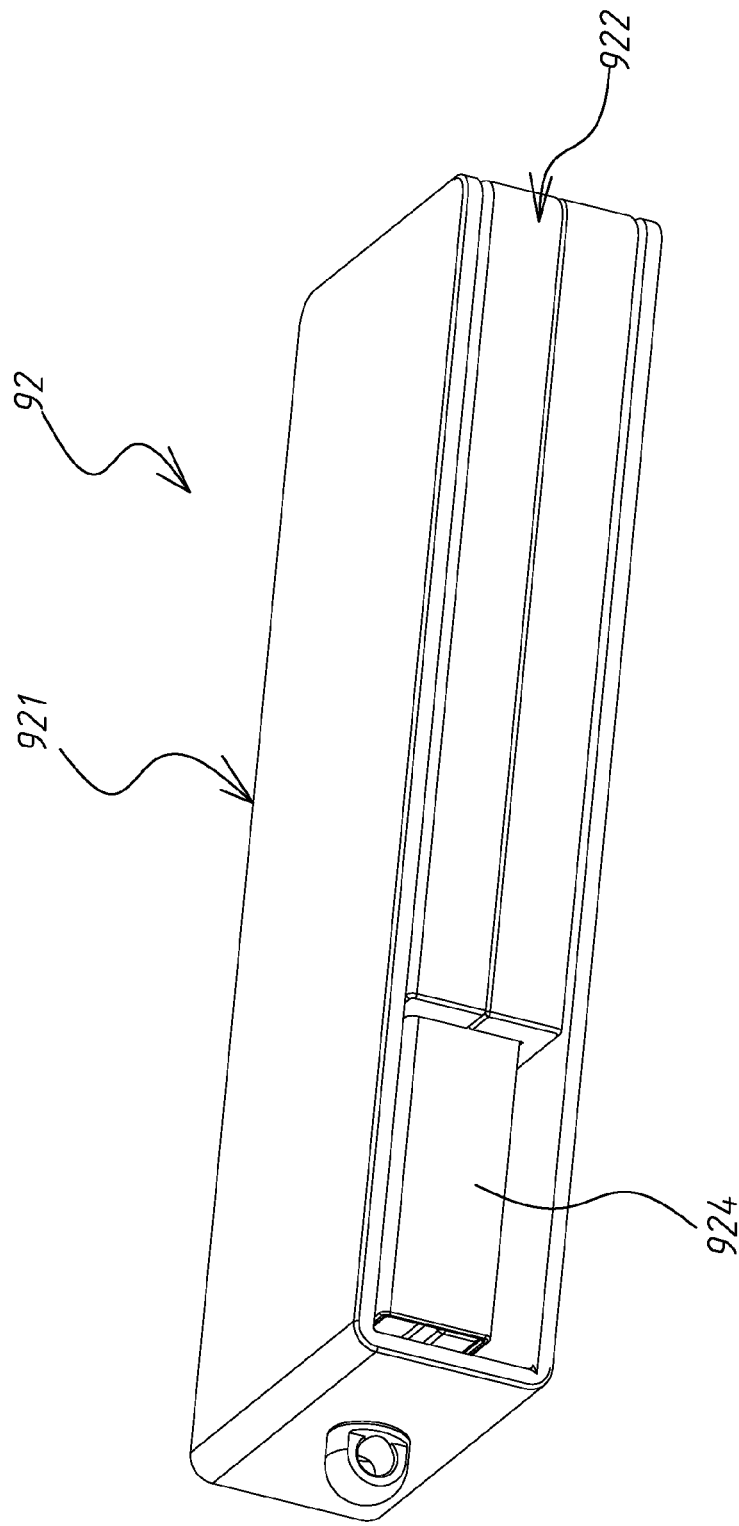
FIG. 3 is an elevational assembly view of the memory stick according to the prior art.
Figure 4:
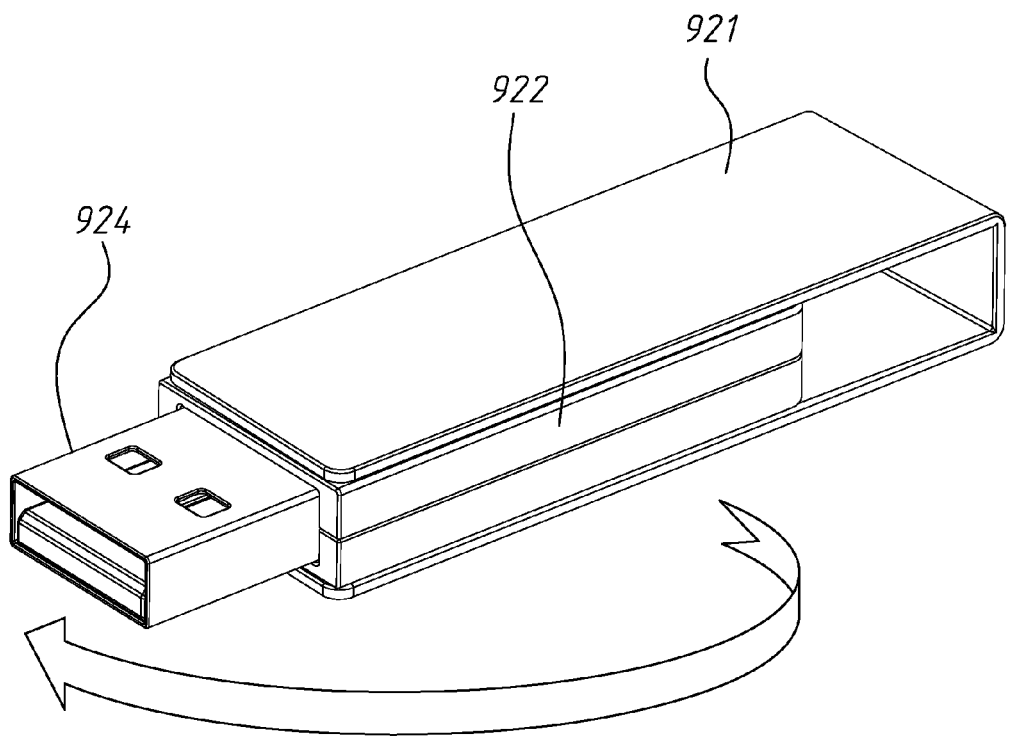
FIG. 4 is a schematic drawing showing an operation status of the memory stick according to the prior art.
Figure 5:
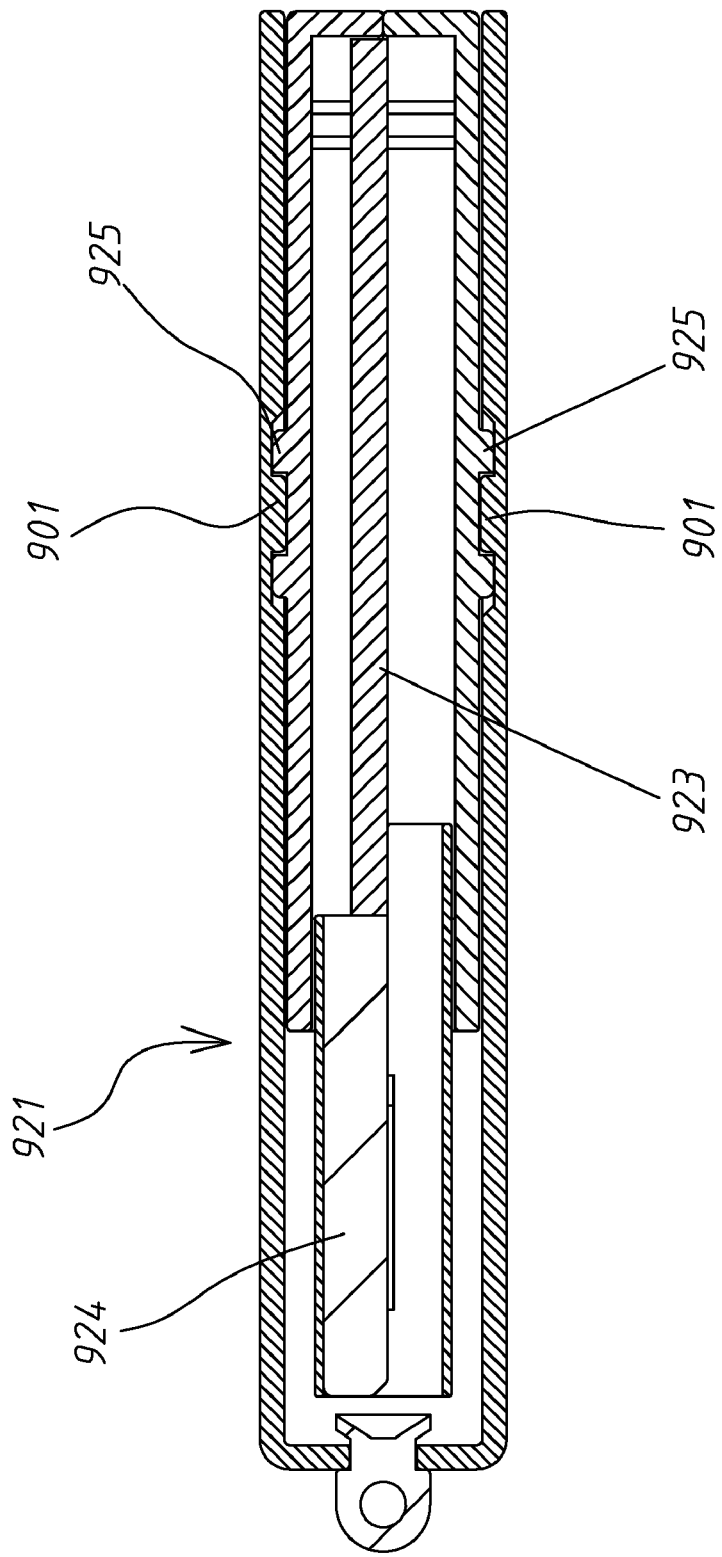
FIG. 5 is a sectional view of the memory stick according to the prior art.
Figure 6A:
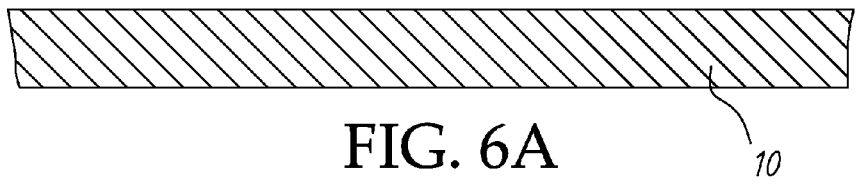
FIGS. 6A~6C illustrate formation of a tenon on one side of a metal plate member in accordance with a first embodiment of the present invention.
Figure 6B:
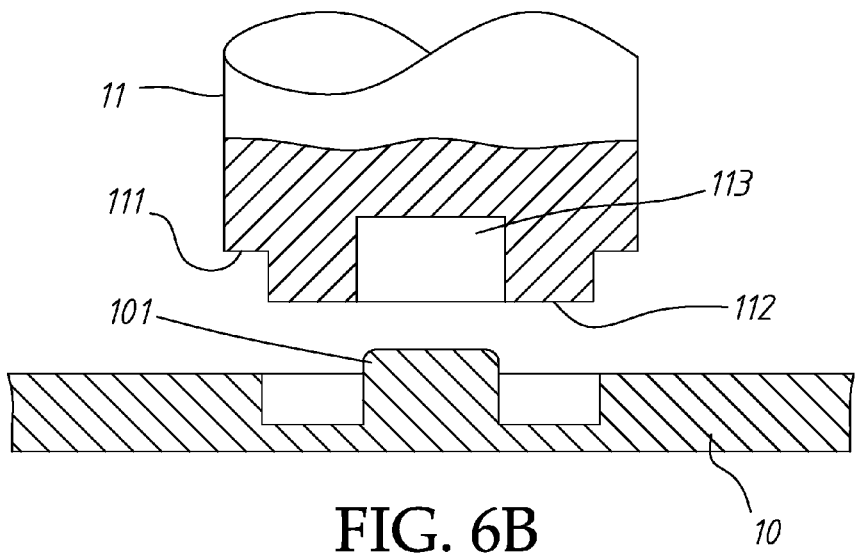
Figure 6C:
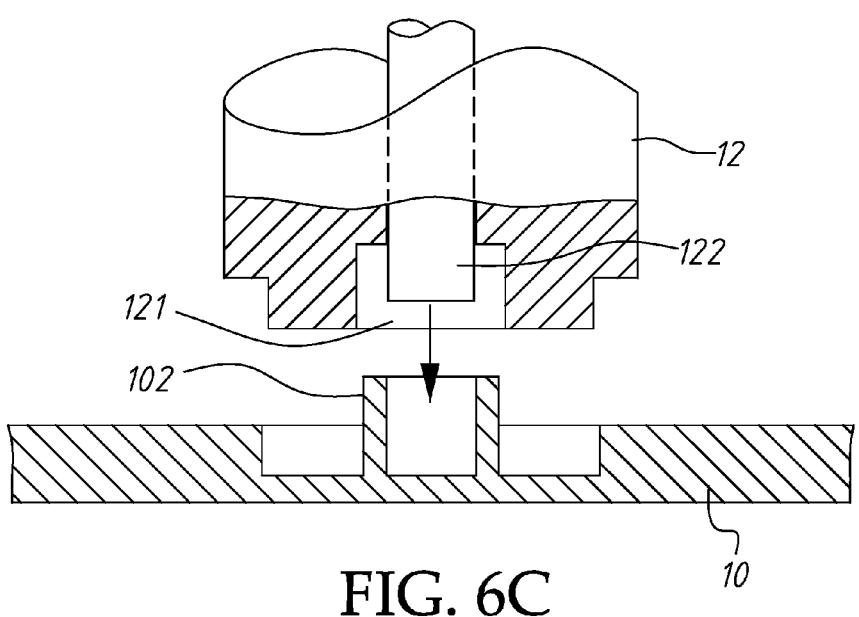
Figure 8:
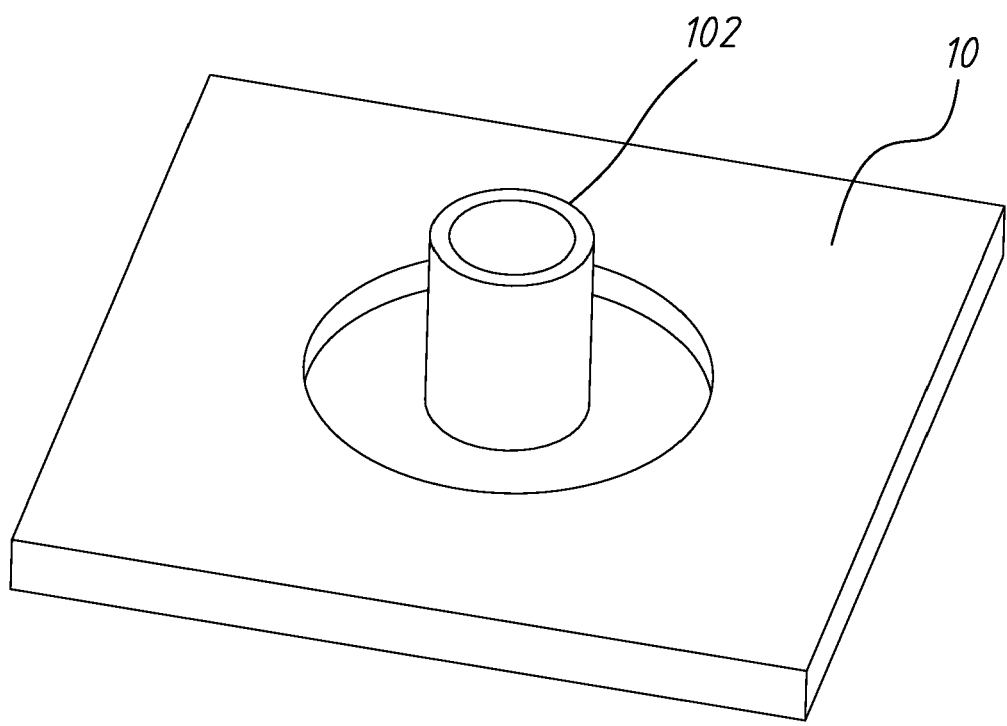
FIG. 8 is an elevational view of a metal plate member with a tenon made according to the present invention.

Referring to FIGS. 6A~6C, a method of forming a tenon on one side of a metal plate member in accordance with a first embodiment of the present invention is shown comprising the steps of:
  a) providing a metal plate member 10;
  b) providing a first punch 11 having an outer step 111, an inner step 112 perpendicularly protruded from the outer step 111 and a first recess 113 at the center of the inner step 112;
  c) punching one side of the metal plate member 10 with the first punch 11 to drive the inner step 112 into the wall of the corresponding side of the metal plate member 10, causing a part of the wall of the corresponding side of the metal plate member 10 to be deformed into a protrusion 101 by the recess 113;
  d) providing a second punch 12 that is prepared subject to the configuration of the surface area of the metal plate member 10 around the protrusion 101 and has a second recess 121 fitting the protrusion 101 and a punch rod 122 axially inserted through and movable up and down relative to the second recess 121; and
  e) punching the protrusion 101 of the metal plate member 10 with the second punch 12 and the punch rod 122 to extend the height of the protrusion 101 and to make the protrusion 101 into a tubular configuration, so that a tenon 102 is formed on one side of the metal plate member 10, as shown in FIG. 8.

Figure 7A:
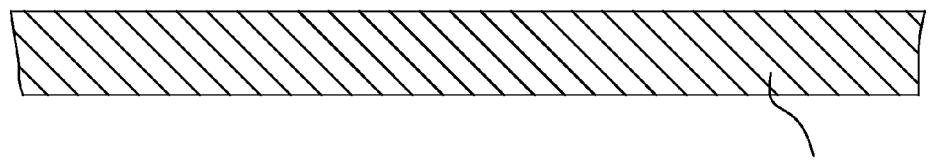
FIGS. 7A~7C illustrate formation of a tenon on one side of a metal plate member in accordance with a second embodiment of the present invention.
Figure 7B:
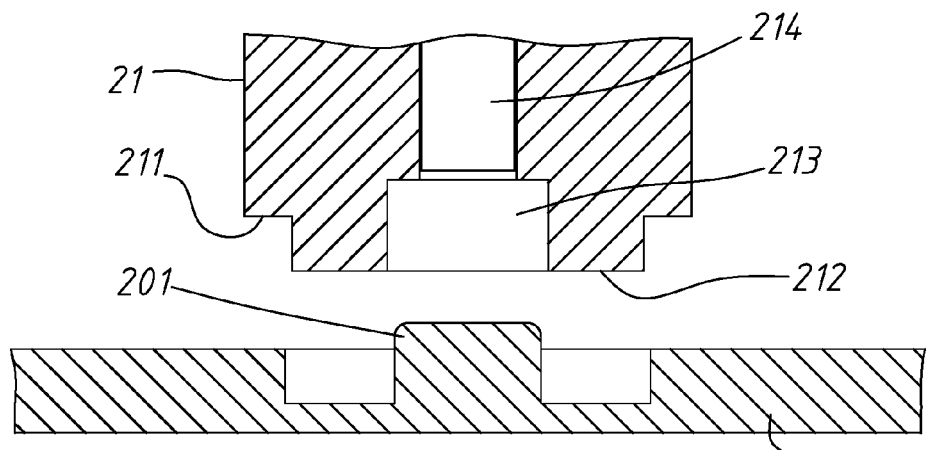
Figure 7C:
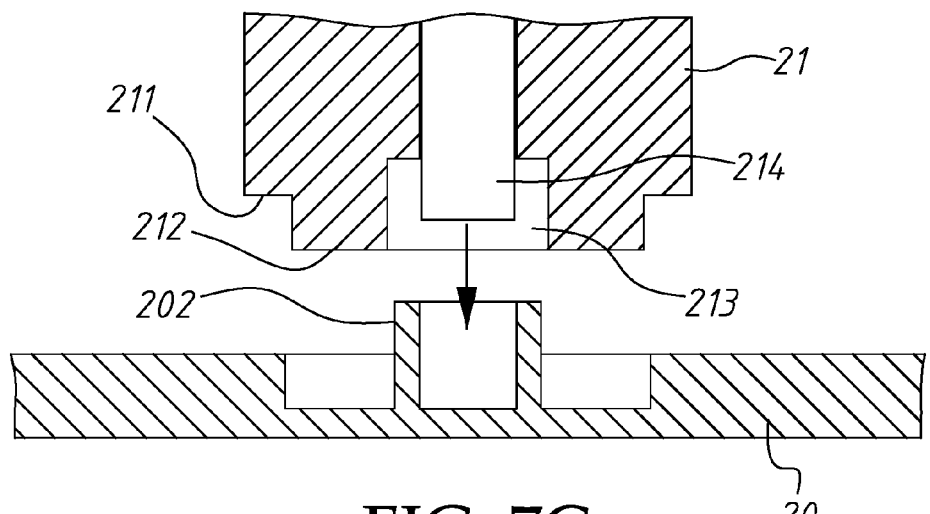

According to a second embodiment of the present invention, one single punch is used to complete the aforesaid two punching steps, thereby forming a tenon on one side of a metal plate member, as shown in FIGS. 7A~7C. According to this second embodiment, the method of forming a tenon on one side of a metal plate member in accordance with the second embodiment of the present invention includes the steps of:
  a) providing a metal plate member 20;
  b) providing a punch 21 having an outer step 211, an inner step 212 perpendicularly protruded from the outer step 211, a recess 213 disposed at the center of the inner step 212 and a punch rod 214 axially inserted through and movable up and down relative to the recess 213;
  c) punching one side of the metal plate member 20 with the punch 21 to drive the inner step 212 into the wall of the corresponding side of the metal plate member 20, causing a part of the wall of the corresponding side of the metal plate member 10 to be deformed into a protrusion 201 by the recess 213;
  d) punching the protrusion 201 with the punch rod 214 to extend the height of the protrusion 201 and to make the protrusion 201 into a tubular configuration, so that a tenon 202 is formed on one side of the metal plate member 20.

According to the aforesaid second embodiment, only one single punch is used, facilitating the fabrication and saving much the fabrication time.

Further, the tenon 102 can be made in a circular shape (see FIG. 8), or an irregular shape.

Figures 9, 9A:
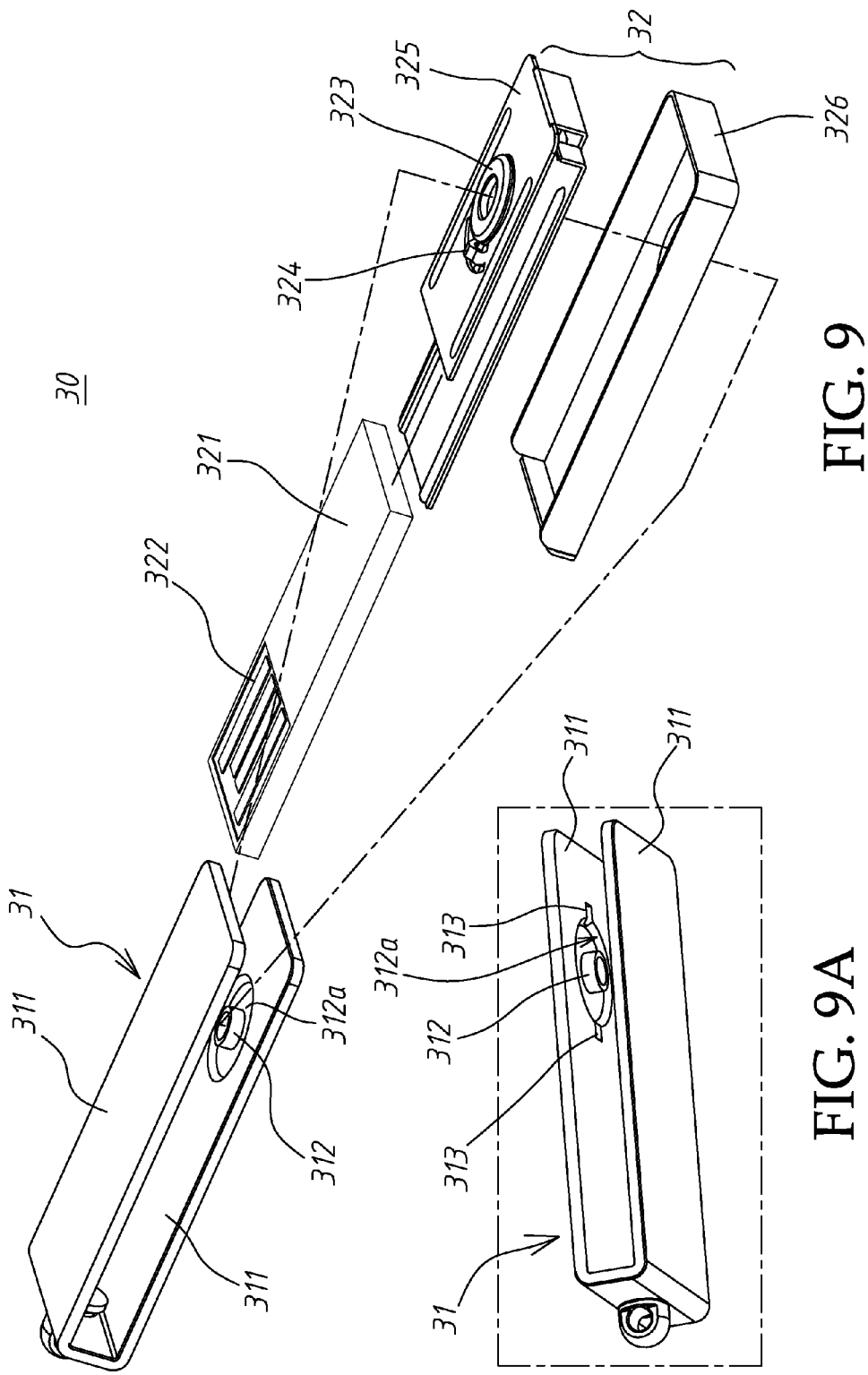
FIG. 9 is an exploded view of the memory stick in accordance with the present invention.
FIG. 9A is an oblique bottom elevation of the ⊏-shaped metal plate member shown in FIG. 9.
Figure 10:
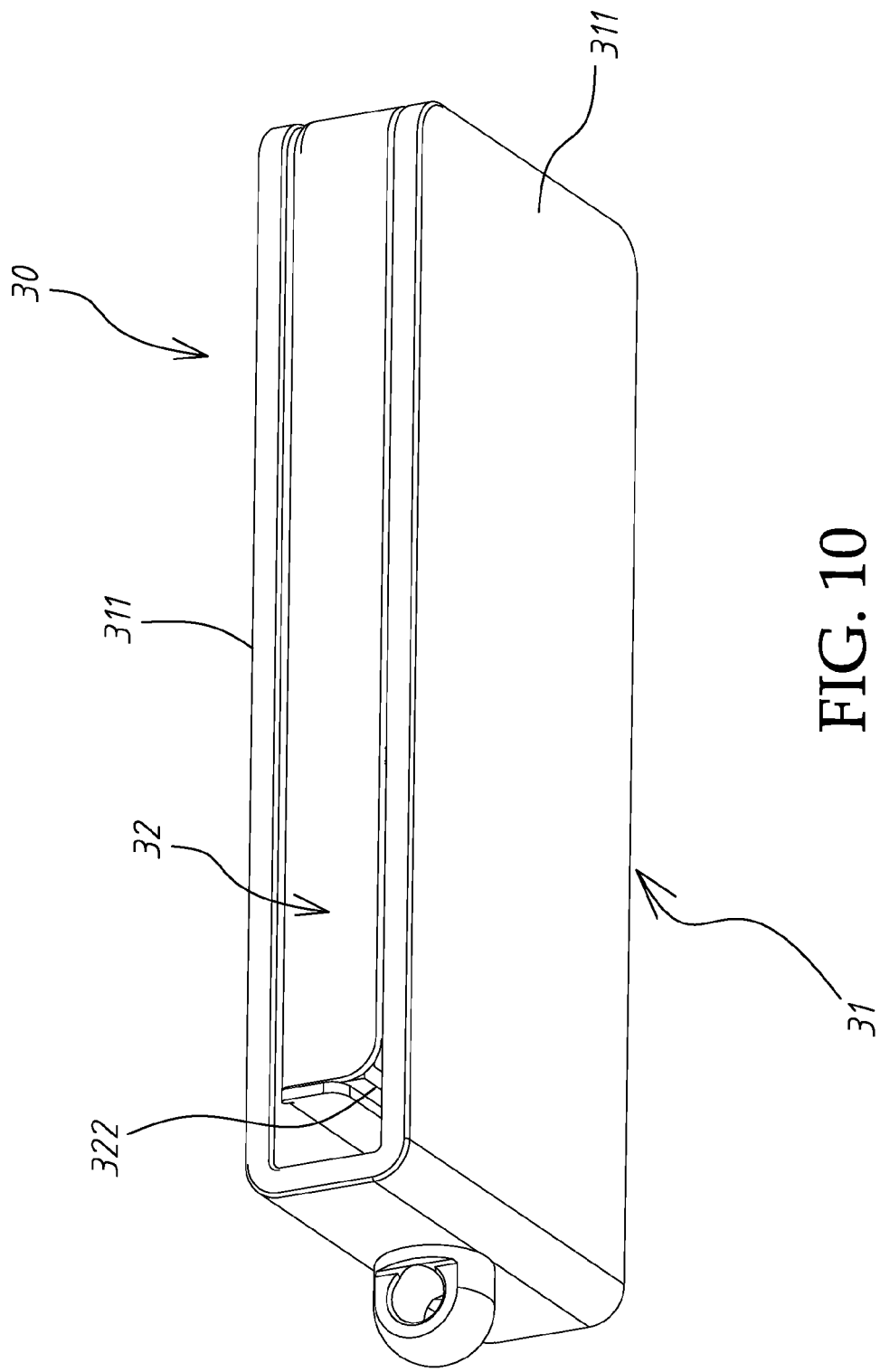
FIG. 10 is an oblique bottom elevational assembly view of the memory stick shown in FIG. 9.
Figures 11, 12:
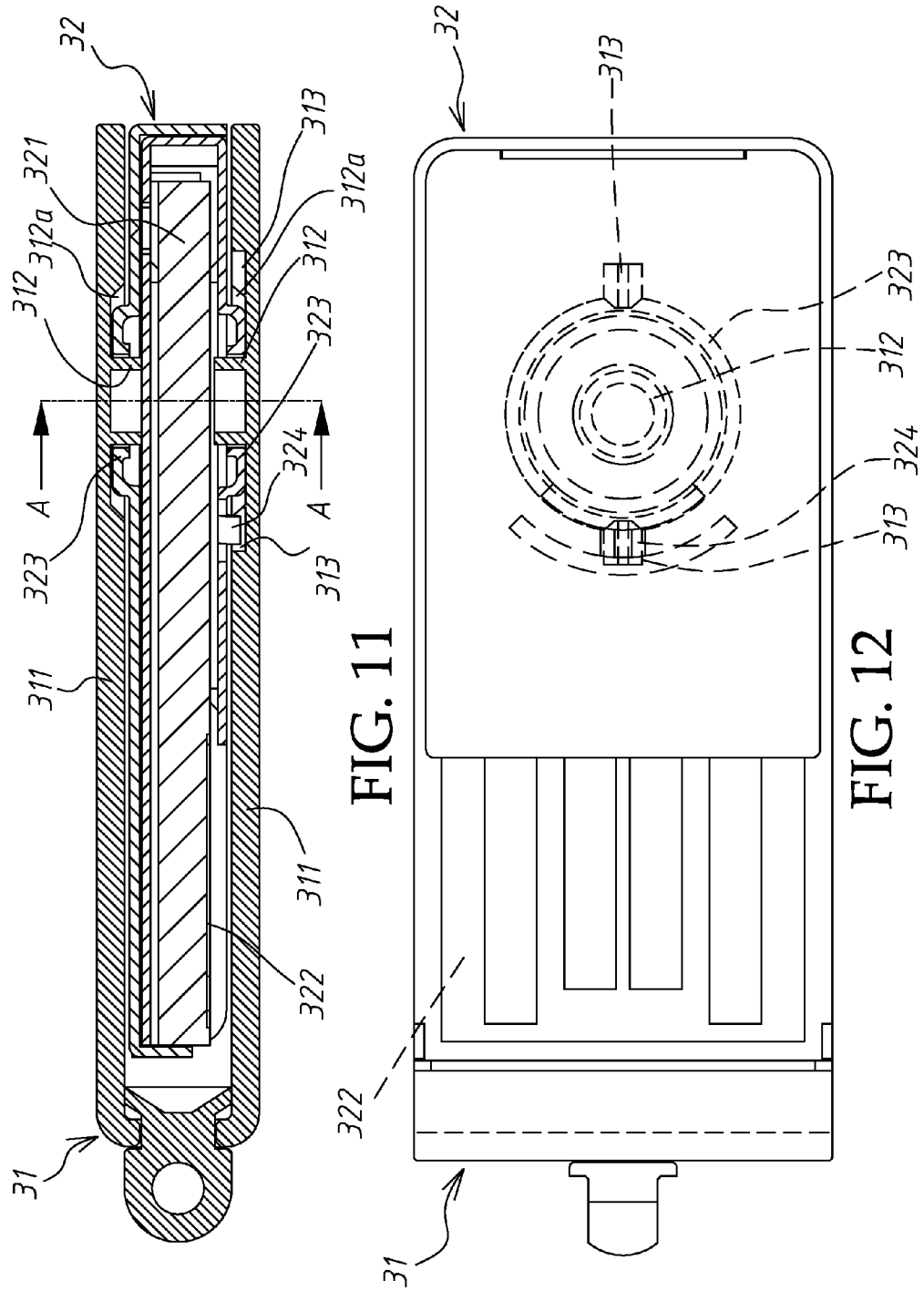
FIG. 11 is a sectional side view of the memory stick shown in FIG. 10.
FIG. 12 is a top plain view of the memory stick shown in FIG. 10.
Figure 13:
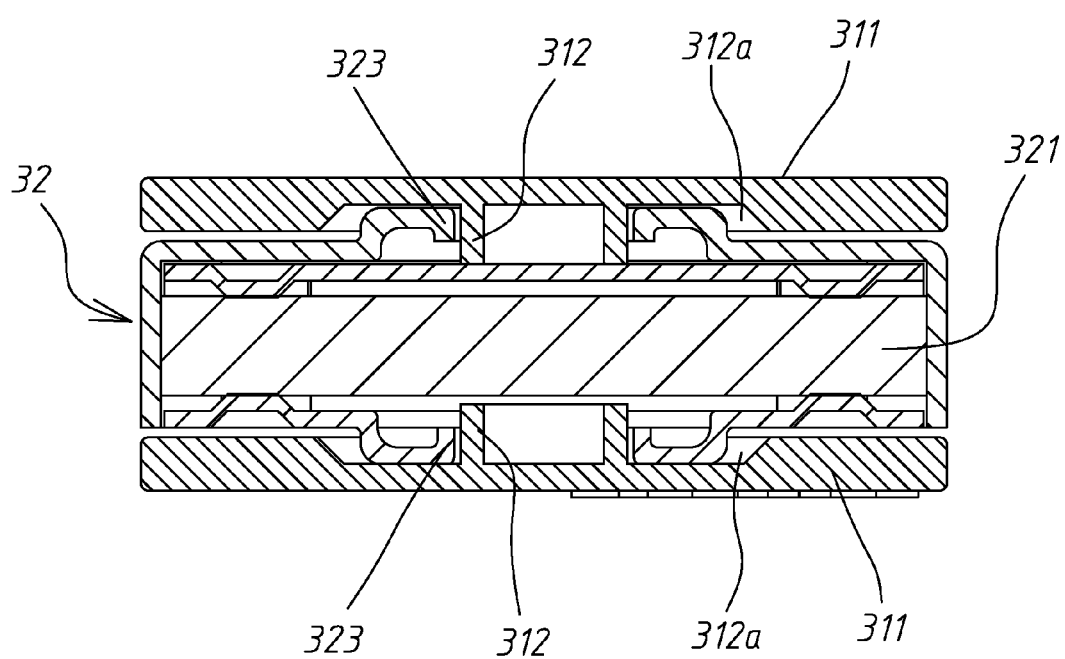
FIG. 13 is a sectional view taken along line A-A of FIG. 13.

FIGS. 9~11 show an application of the aforesaid method of forming a tenon on one side of a metal plate member in a memory stick in the fabrication of a memory stick. As illustrated, the memory stick 30 comprises a ⊏-shaped metal plate member 31 and a casing 32.

The ⊏-shaped metal plate member 31 has two tenones 312 respectively protruded from the inner wall thereof at two opposite sides and aimed at each other. The tenones 312 are formed on the inner wall of the ⊏-shaped metal plate member 31 subject to one of the method of forming a tenon on one side of a metal plate member according to the aforesaid first and second embodiments of the present invention. A tenon 312 is formed on each of the two planar inner walls 311 of the ⊏-shaped metal plate member 31 and a recess 312a is located around the bottom side of the tenon 312 (see FIGS. 9, 9A, 11 and 13) by punching, so that the tenones 312 and the axle holders 323 can be positively coupled together, avoiding falling. Further, the ⊏-shaped metal plate member 31 is limited to a metal material.

The casing 32 consists of an upper shell 325 and a bottom shell 326, and accommodates a PC board 321 that has a USB connector 322 forwardly extended from its one end. The PC board 321 is packaged in between the upper shell 325 and a bottom shell 326. The casing 32 is set in the ⊏-shaped metal plate member 31, having two pivot holders 323 symmetrically located on the upper shell 325 and the bottom shell 326 and respectively pivotally coupled to the tenones 312 of the ⊏-shaped metal plate member 31 for enabling the ⊏-shaped metal plate member 31 to be turned relative to the casing 32 to close or open the USB connector 322.

The casing 32 of the memory stick 30 further comprises two raised portions 324 respectively located on the upper shell 325 and the bottom shell 326 adjacent to the respective pivot holders 323. The ⊏-shaped metal plate member 31 comprises two locating grooves 313 symmetrically disposed at two opposite sides relative of each of the two tenones 312 (see FIG. 9A) for receiving the raised portions 324 of the casing 32 selectively.

When the ⊏-shaped metal plate member 31 is turned relative to the casing 32 to force each raised portions 324 into one of the two associating locating grooves 313, the ⊏-shaped metal plate member 31 is locked to the casing 32 in the close position to shield the USB connector 322, as shown in FIG. 12.

Figure 14:
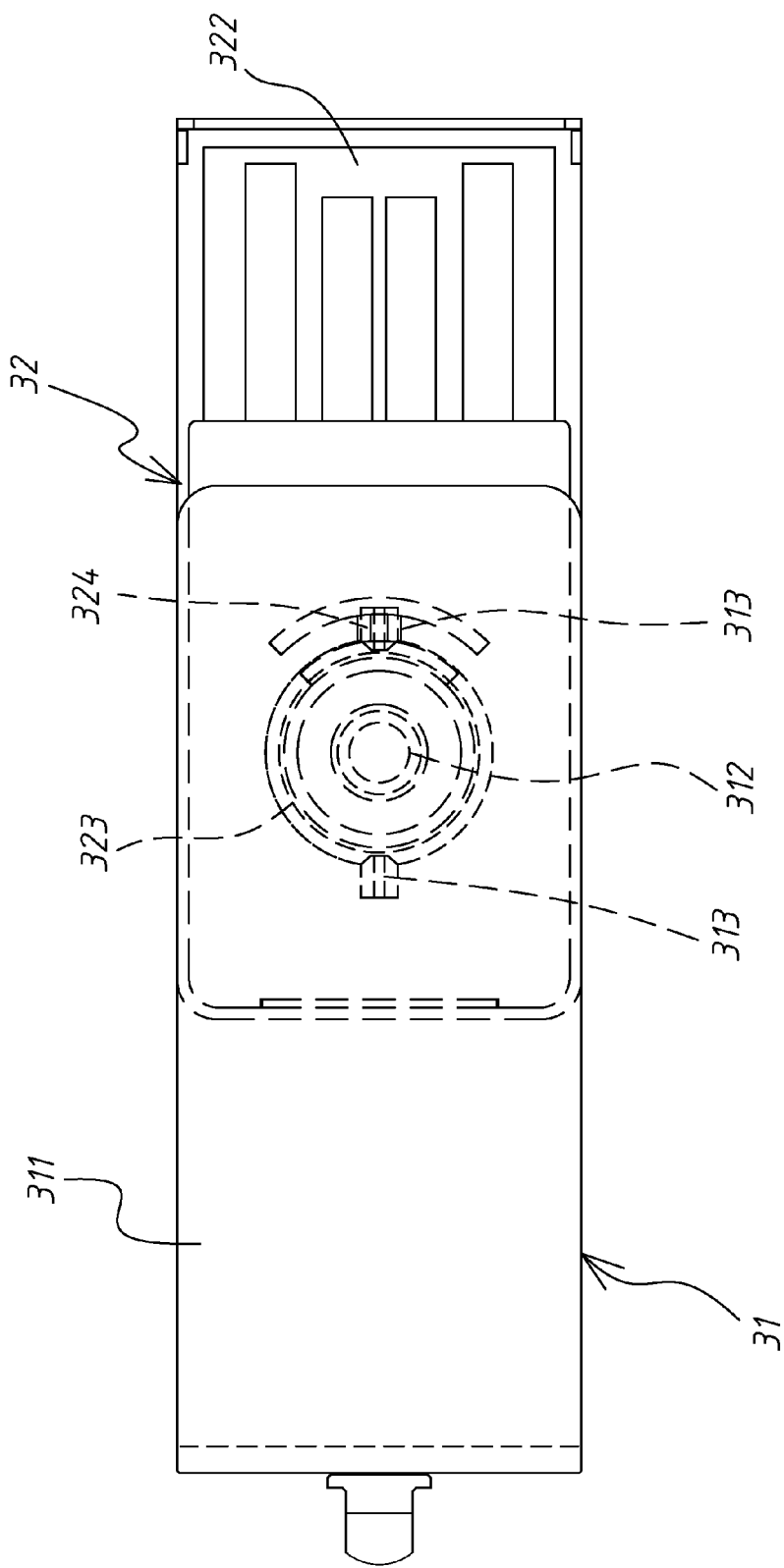
FIG. 14 corresponds to FIG. 13, showing the USB connector extended out.
Figure 15:
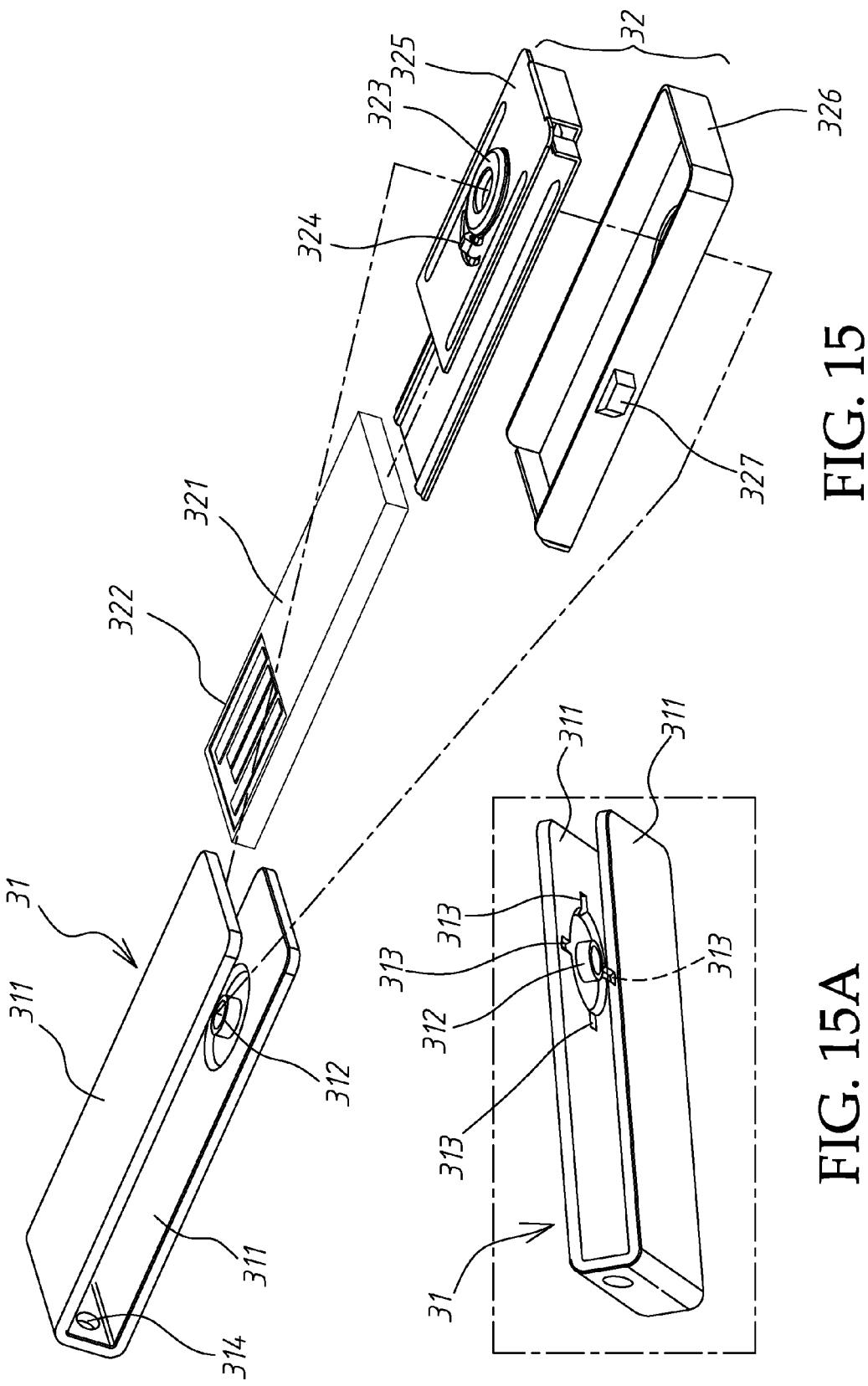
FIG. 15 is an exploded view of an alternate form of the memory stick in accordance with the present invention.

On the contrary, when the ⊏-shaped metal plate member 31 is turned relative to the casing 32 to force each raised portion 324 into the other one of the two associating locating grooves 313, as shown in FIG. 14, the ⊏-shaped metal plate member 31 is locked to the casing 32 in the open position where the USB connector 322 is exposed to the outside for insertion into a USB jack of a computer.

Referring to FIGS. 12 and 14, each tenon 312 of the ⊏-shaped metal plate member 31 of the memory stick 30 is formed by means of punching the inner wall of the ⊏-shaped metal plate member 31 with a punch to form a protrusion and then punching the protrusion with a punch rod to extend the height and to make the protrusion into a tubular configuration. Subject to the application of the present invention, the height of the tenones 312 of the ⊏-shaped metal plate member 31 is greatly extended, so that the ⊏-shaped metal plate member 31 and the casing 32 can be accurately and pivotally secured together and biasing the ⊏-shaped metal plate member 31 relative to the casing 32 does not cause the casing 32 to fall from the ⊏-shaped metal plate member 31.

Figure 16:
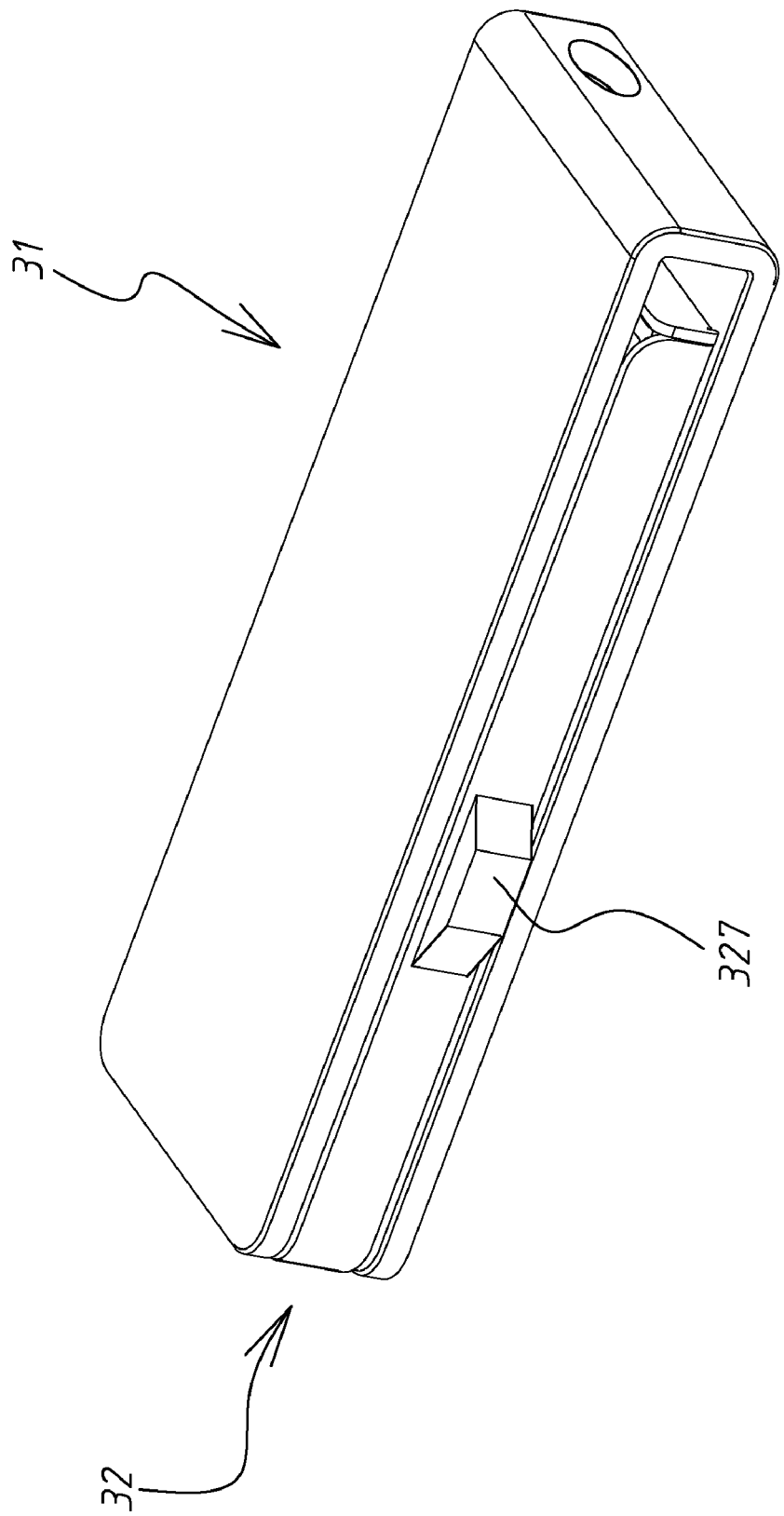
FIG. 16 is an elevational assembly view of the memory stick shown in FIG. 15.
Figure 17:
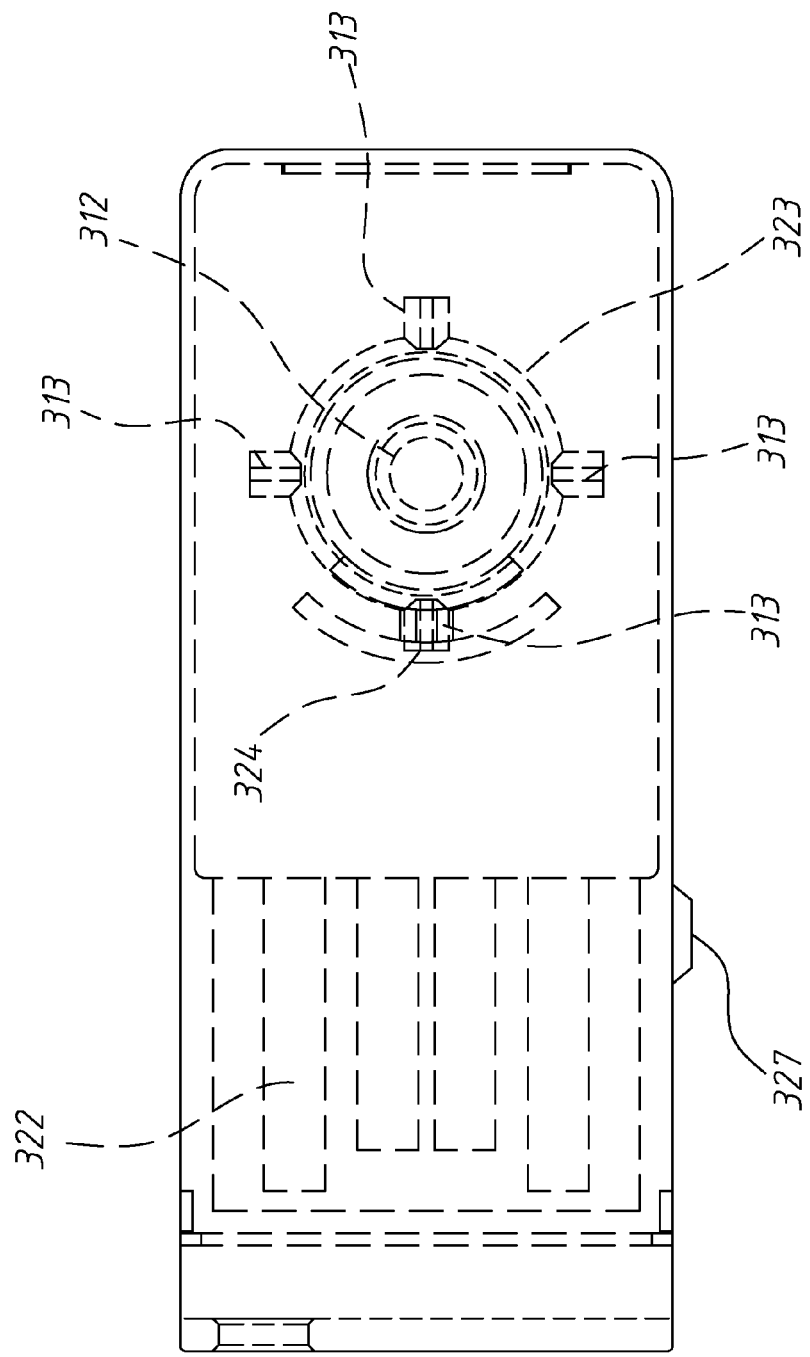
FIG. 17 is a top plain view of the memory stick shown in FIG. 16.
Figure 18:
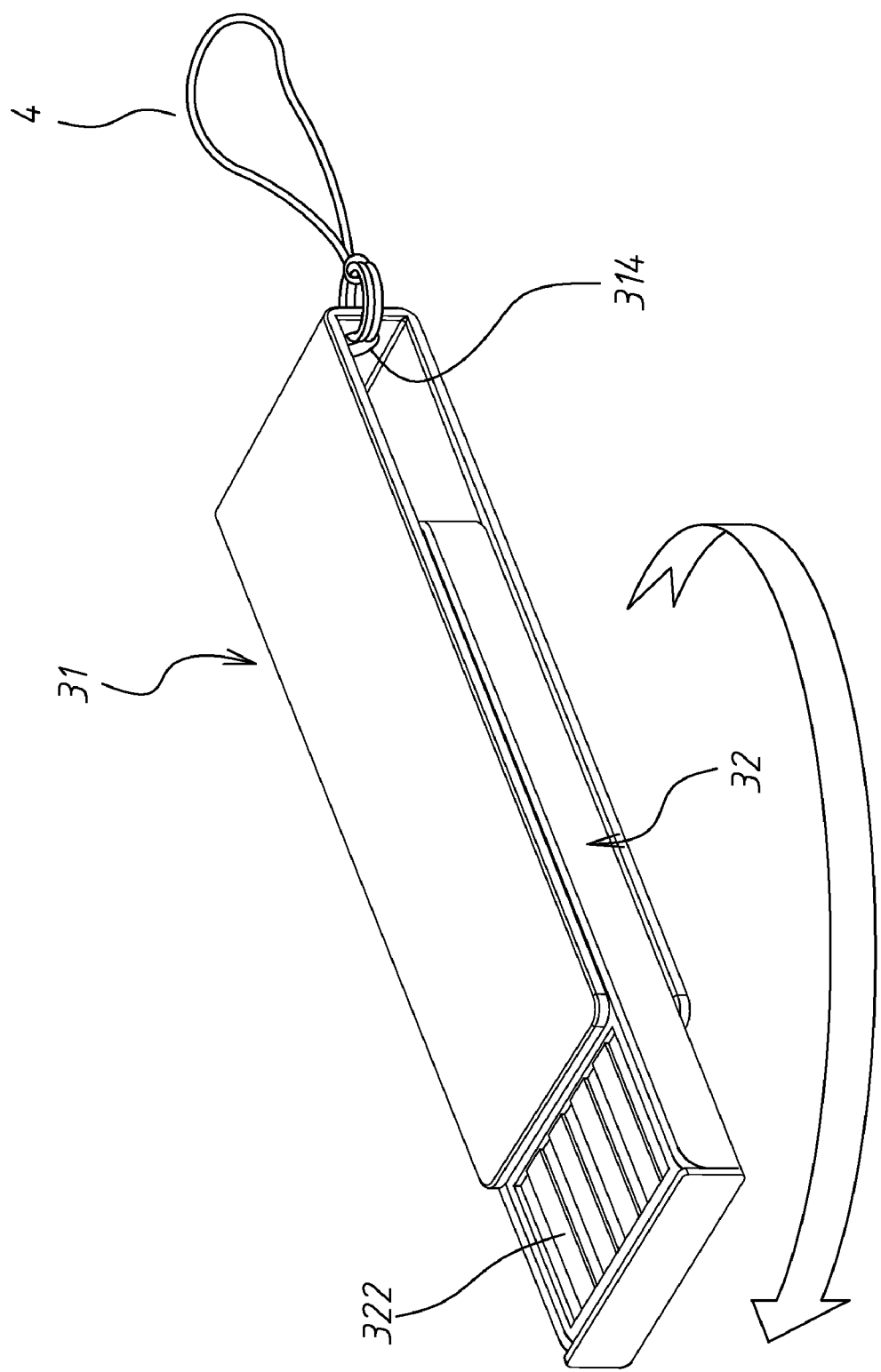
FIG. 18 corresponds to FIG. 17, showing the USB connector extended out.

FIGS. 15~18 illustrate an alternate form of the memory stick. This alternate form is substantially similar to that shown in FIGS. 9~14 with the exception that the ⊏-shaped metal plate member 31 comprises two sets of locating grooves 313, and the number of each set of locating grooves 313 is 4 that are equiangularly spaced around the associating tenon 312 (see FIG. 15A). Thus, when the casing 32 the ⊏-shaped metal plate member 31 is turned relative to through every 90-degrees, each raised portion 324 is forced into one associating locating groove 313. Further, the casing 32 has a protruding block 327 protruded from one lateral side of the bottom shell 326 and suspending outside the ⊏-shaped metal plate member 31, as shown in FIGS. 16 and 17, facilitating user manipulation to turn the casing 32 out of the ⊏-shaped metal plate member 31. Further, as shown in FIG. 18, the ⊏-shaped metal plate member 31 has a wire hole 314 for the fastening of a cord member 4.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A memory stick, comprising:

a ⊏-shaped metal plate member, said ⊏-shaped metal plate member comprising two tenones respectively protruded from an inner wall thereof at two opposite sides and aimed at each other, each said tenon being formed on said inner wall of said ⊏-shaped metal plate member by means of punching said inner wall of said ⊏-shaped metal plate member with a punch and forming a protrusion and a recess located around said protrusion and then punching said protrusion with a second punch to recess a center part of said protrusion and to extend the height of said protrusion, thereby deforming said protrusion into a tubular configuration; and a casing holding therein a PC board, said PC board having a USB connector located on one end thereof, said casing being set in said ⊏-shaped metal plate member, said casing comprising two outwardly protruding pivot holders respectively disposed corresponding to said tenones of said ⊏-shaped metal plate member, said pivot holders being respectively inserted into the recess around the protrusion of each of said tenones for enabling said ⊏-shaped metal plate member to be biased relative to said casing to close or open said USB connector.

2. The memory stick as claimed in claim 1, wherein said ⊏-shaped metal plate member comprises two pairs of locating grooves located on the inner wall thereof at two opposite sides relative to each of said two tenones; said casing comprises two raised portions respectively disposed adjacent to said two pivot holders for selectively engaging into said locating grooves to lock said casing to said ⊏-shaped metal plate member in one of two reversed positions to close or open said USB connector.

3. The memory stick as claimed in claim 1, wherein said ⊏-shaped metal plate member comprises a plurality of locating grooves located on the inner wall thereof and respectively spaced around each said tenon at a pitch of 90-degrees; said casing comprises two raised portions respectively disposed adjacent to said two pivot holders for selectively engaging into said locating grooves to lock said casing to said ⊏-shaped metal plate member in one of a series of angular positions.

4. The memory stick as claimed in claim 1, wherein said casing comprises a protruding block protruded from one lateral side thereof and suspending outside said ⊏-shaped metal plate member.

5. The memory stick as claimed in claim 1, wherein said ⊏-shaped metal plate member comprises a wire hole for the fastening of a cord member.

\* \* \* \* \*